(12) United States Patent
Lee

(10) Patent No.: US 7,567,469 B2
(45) Date of Patent: Jul. 28, 2009

(54) OVER DRIVING PULSE GENERATOR

(75) Inventor: Sang-Hee Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/647,630

(22) Filed: Dec. 29, 2006

(65) Prior Publication Data

US 2008/0002501 A1 Jan. 3, 2008

(30) Foreign Application Priority Data

Jun. 29, 2006 (KR) .................. 10-2006-0059068

(51) Int. Cl.
*G11C 5/14* (2006.01)

(52) U.S. Cl. .................. 365/189.09; 365/189.011; 365/189.15; 365/194; 327/378

(58) Field of Classification Search ............ 365/189.01, 365/189.15, 189.09, 194, 189.011; 327/378
See application file for complete search history.

(56) References Cited

U.S. PATENT DOCUMENTS

| | | | | | |
|---|---|---|---|---|---|
| 5,220,221 | A | * | 6/1993 | Casper ...................... | 327/51 |
| 5,231,319 | A | * | 7/1993 | Crafts et al. ................. | 327/277 |
| 5,544,110 | A | * | 8/1996 | Yuh ........................ | 365/205 |
| 5,773,999 | A | * | 6/1998 | Park et al. ................. | 327/108 |
| 6,009,030 | A | * | 12/1999 | Seo ........................ | 365/205 |
| 6,803,803 | B1 | * | 10/2004 | Starr et al. ................. | 327/378 |
| 6,853,593 | B1 | | 2/2005 | Bae | |
| 7,005,625 | B1 | * | 2/2006 | Mitchell .................... | 250/207 |
| 7,084,684 | B2 | * | 8/2006 | Kim et al. ................. | 327/276 |
| 2002/0081789 | A1 | * | 6/2002 | Kim et al. ................. | 438/200 |
| 2003/0043538 | A1 | * | 3/2003 | Iwanari ...................... | 361/684 |
| 2005/0013175 | A1 | * | 1/2005 | Bae ......................... | 365/189.09 |
| 2005/0077943 | A1 | * | 4/2005 | Kakuda et al. .............. | 327/277 |
| 2006/0158238 | A1 | * | 7/2006 | Jung ......................... | 327/273 |
| 2006/0170484 | A1 | * | 8/2006 | Son ........................ | 327/530 |
| 2006/0203568 | A1 | * | 9/2006 | Hirobe ..................... | 365/189.01 |

FOREIGN PATENT DOCUMENTS

| | | |
|---|---|---|
| JP | 10-302467 | 11/1998 |
| JP | 10-340583 | 12/1998 |
| JP | 2000-285676 | 10/2000 |
| JP | 2002-074960 | 3/2002 |
| KR | 100273274 B1 | 9/2000 |
| KR | 1020020057280 A | 7/2002 |
| KR | 100571648 B2 | 4/2006 |

* cited by examiner

*Primary Examiner*—Huan Hoang
*Assistant Examiner*—Jay Radke
(74) *Attorney, Agent, or Firm*—Blakely, Sokoloff, Taylor & Zafman

(57) ABSTRACT

A semiconductor memory device controls an over driving period according to fluctuation of a supply voltage VDD. The semiconductor memory device includes a bit line sense amplifier, a sense amplifying driver and an over driving controller. The over driving controller includes a delay unit for delaying an input signal, a supply voltage detector for detecting the level of the supply voltage VDD, a delaying controller for controlling a delay time of the delay unit in response to an output of the supply voltage detector, and an output unit for outputting a over driving pulse, whose width is controlled according to the fluctuation of the supply voltage VDD, by performing a logic operation to the input signal and an output of the delay unit.

13 Claims, 5 Drawing Sheets

OVER DRIVING PULSE GENERATOR

CROSS-REFERENCE TO RELATED APPLICATIONS

The present invention claims priority of Korean patent application number 10-2006-0059068, filed in the Korean Patent Office on Jun. 29, 2006, which is incorporated by reference in its entirety.

BACKGROUND OF THE INVENTION

The present invention relates to a semiconductor memory device; and, more particularly, to the semiconductor memory device for providing a bit line sense amplifier which can support an over driving operation during a data access.

As generally known, data stored in memory cells of a DRAM is amplified to be read by bit line sense amplifiers. At initial enable period of the bit line sense amplifiers, a DRAM performs an operation to supply increased supply voltage to the bit line sense amplifiers, which is called the over driving operation.

FIG. 1 illustrates a signal timing diagram explaining an operation of a conventional semiconductor memory device. When a selected word line WL in the memory cell is activated, the data, i.e., charges, stored in the memory cell are transmitted to a bit line pair. Accordingly, the bit line BL and a bit line bar BLB have a fine voltage potential deference dV, which occurs in a period 102.

Thereafter, a bit line sense amplifier is enabled and voltage levels of the bit line BL and the bit line bar BLB are boosted up into a core voltage VCORE and a ground voltage VSS respectively. Driving supply lines of the bit line sense amplifier are supplied with supply voltages for enabling the bit line sense amplifier. The first driving supply line (RTO line) is supplied with the core voltage and the second driving supply line (SB line) is supplied with the ground voltage VSS.

At the initial enable period of the bit line sense amplifier, the RTO line is supplied with higher voltage than the core voltage VCORE for the over driving operation. The over driving period 103 described in FIG. 1 is determined according to the width of an over driving pulse.

FIG. 2 illustrates a schematic circuit diagram showing a conventional over driving pulse generator, and FIG. 3 illustrates a signal timing diagram depicting an operation of the conventional over driving pulse generator.

The conventional over driving pulse generator includes a delay unit 201, a NAND gate 202 and an inverter 203. The delay unit 201 is provided with odd number of inverters in series to delay an input signal 211. The NAND gate 202 receives the input signal 211 and an output of the delay unit 201. The inverter 203, inverting an output of the NAND gate 202, outputs over driving pulse ODP.

The input signal 211 on a node A is activated in response to an active command and is inactivated in response to a precharge command. The input signal 211 is a signal delayed until operation of the bit line sense amplifier after the active command is input. When the input signal 211 is input to the node A, a delayed signal 212 is generated by the delay unit 201. The NAND gate 202 and the inverter 203 perform a logic operation to the input signal 211 and the delayed signal 212. The conventional over driving pulse generator generates the over driving pulse ODP having activation period by a delay time of the delay unit 201. The width of the over driving pulse ODP is determined according to the predetermined delay time.

As the width of the over driving pulse ODP is wide when a supply voltage VDD is a high level, the level of the core voltage VCORE is increased. A discharge operation which compares the core voltage VCORE with a reference voltage and discharges the core voltage VCORE according to the comparison result is required in order to decrease the core voltage VCORE. Unnecessary power is consumed.

In addition, because a bit line precharge voltage VBLP is generated based on the core voltage VCORE, the level of the bit line precharge voltage VBLP is also increased. Due to the increased bit line precharge voltage, the voltage potential difference dV between the bit line BL and a bit line bar BLB is changed. When sensing a logic high level of data transmitted to the bit line pair from the memory cell, malfunction may be caused.

In case when the supply voltage VDD is a low level, for example, the supply voltage VDD is a 1.8 voltage level and the core voltage VCORE is a 1.6 voltage level in DDR2 SDRAM, a power for increasing the core voltage VCORE is insufficiently supplied if the over driving pulse ODP has a short pulse width. The power consumed represents the lack of the core voltage VCORE. If active commands are subsequently input before the core voltage VCORE is recovered, malfunctions or character deterioration of parameters such as tRCD can be caused.

SUMMARY OF THE INVENTION

It is, therefore, an object of the present invention to provide a semiconductor memory device for controlling an over driving period according to fluctuation of a supply voltage.

Another object of the present invention is an over driving pulse generator for controlling an activation width of an over driving pulse according to the fluctuation of the supply voltage.

In accordance with an aspect of the present invention, there is provided a semiconductor memory device, including a bit line sense amplifier for amplifying a voltage potential difference of a bit line pair, a sense amplifying driver for supplying a high driving voltage to enable the bit line sense amplifier during an over driving period, and an over driving controller for controlling the over driving period according to the fluctuation of the supply voltage.

In accordance with an another aspect of the present invention, there is also provided an over driving pulse generator, including a delay unit for delaying an input signal, a supply voltage detector for detecting the level of the supply voltage, a delaying controller for controlling a delay time of the delay unit in response to an output signal of the supply voltage detector, and an output unit for outputting a pulse, whose width is controlled according to the fluctuation of the supply voltage, by performing a logic operation to the input signal and an output of the delay unit.

DESCRIPTION OF SPECIFIC EMBODIMENTS

In the present invention, the over driving period is relatively lengthened when the level of the supply voltage VDD is low. When the level of the supply voltage VDD is high, the over driving period is relatively shortened. Accordingly, power consumption or malfunctions by a high level of the supply voltage VDD and insufficiency for the core voltage VCORE or malfunctions by a low level of the supply voltage VDD are prevented.

Hereinafter, a semiconductor memory device in accordance with the present invention will be described in detail referring to the accompanying drawings.

Figure 1:
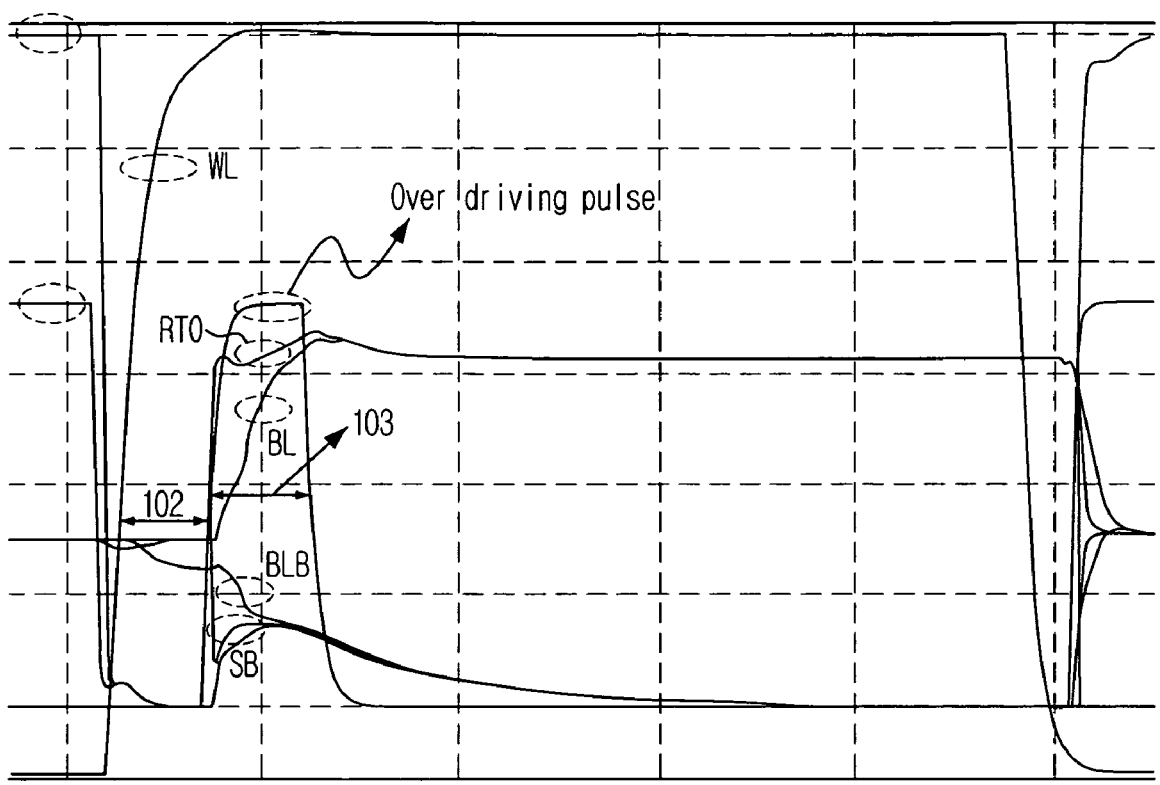
FIG. 1 illustrates a signal timing diagram explaining an operation of a conventional semiconductor memory device.
Figure 2:
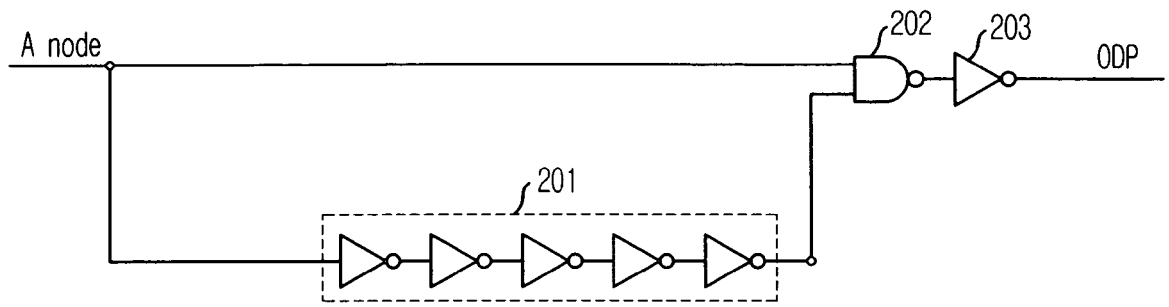
FIG. 2 illustrates a schematic circuit diagram showing a conventional over driving pulse generator.
Figure 3:
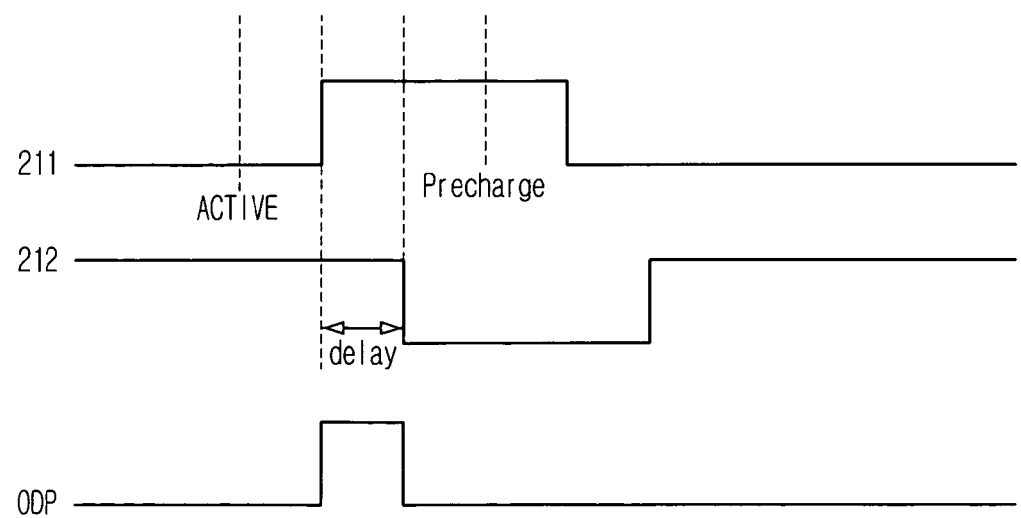
FIG. 3 illustrates a signal timing diagram depicting an operation of a conventional over driving pulse generator.
Figure 4:
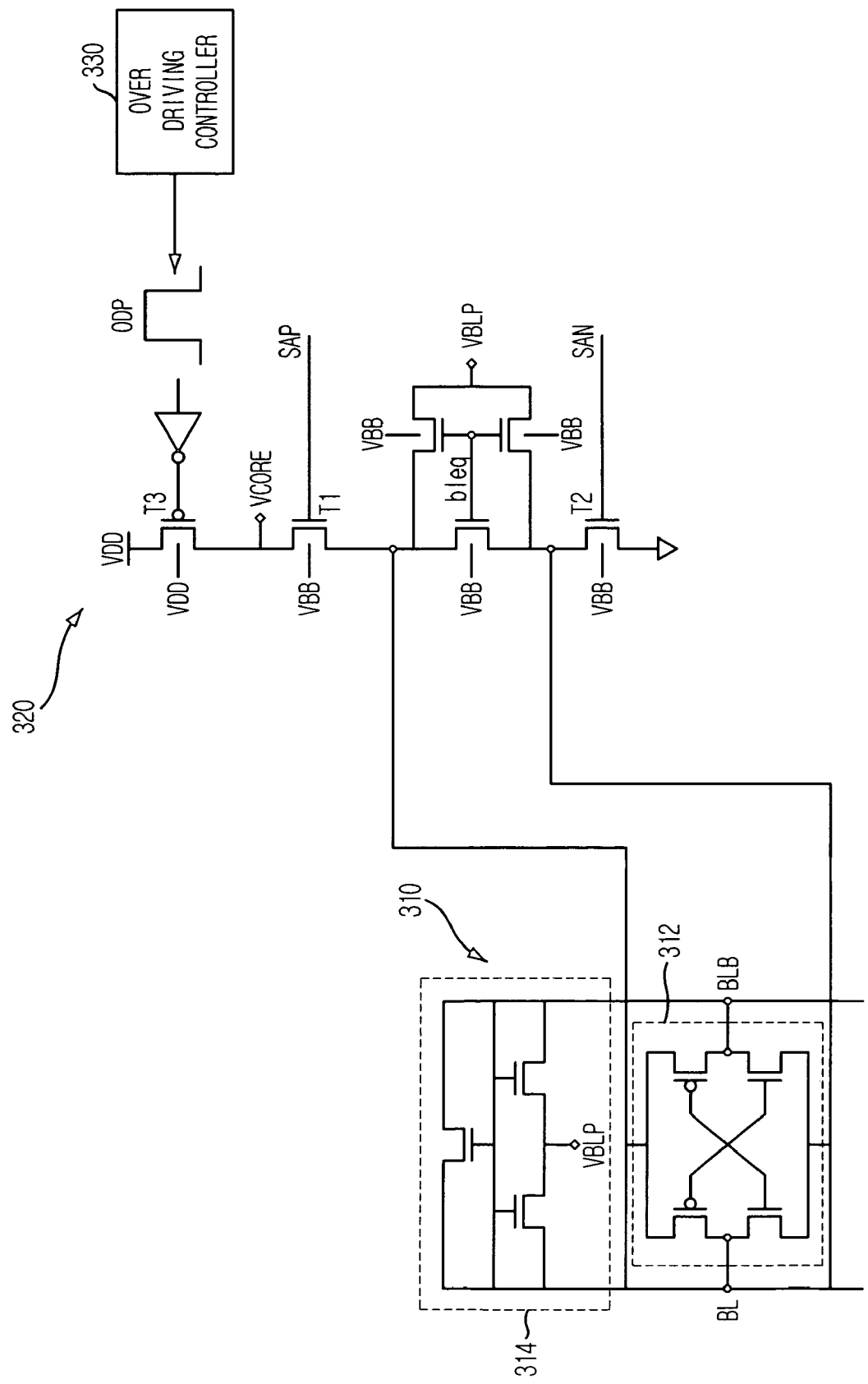
FIG. 4 illustrates a schematic circuit diagram showing a core structure of a memory device in accordance with the present invention.

FIG. 4 is a schematic circuit diagram showing a core structure of a memory device in accordance with the present invention. The core of the memory device includes a bit line sense amplifier 310, a sense amplifying driver 320 and an over driving controller 330.

The bit line sense amplifier 310 is provided with a latch type of sense amplifier 312 for amplifying a voltage potential difference of a bit line pair BL and BLB and a precharger 314 for equalizing and precharging the bit line pair BL and BLB. The sense amplifier 312 is supplied with supply voltages through RTO and SB lines.

When control signals SAP and SAN are activated, the sense amplifying driver 320 turns on transistors T1 and T2 and supplies RTO and SB lines with the core voltage VCORE and the ground voltage VSS respectively. At an initial enable operation of the sense amplifier, an over driving pulse ODP turns on a transistor T3, and a supply voltage VDD node and a core voltage VCORE node are connected. The RTO line is supplied with a high voltage having a higher voltage level than the core voltage VCORE during a period which is determined by a width of the over driving pulse ODP.

The over driving controller 330 generating the over driving pulse ODP include a pulse generator. The width of the over driving pulse ODP is controlled according to the fluctuation of the supply voltage VDD. As the supply voltage rises, the pulse width decreases. Likewise, as the supply voltage VDD decreases, the pulse width increases. The pulse width determines a turn-on timing of the transistor T3 and determines the over driving period.

Figure 5:
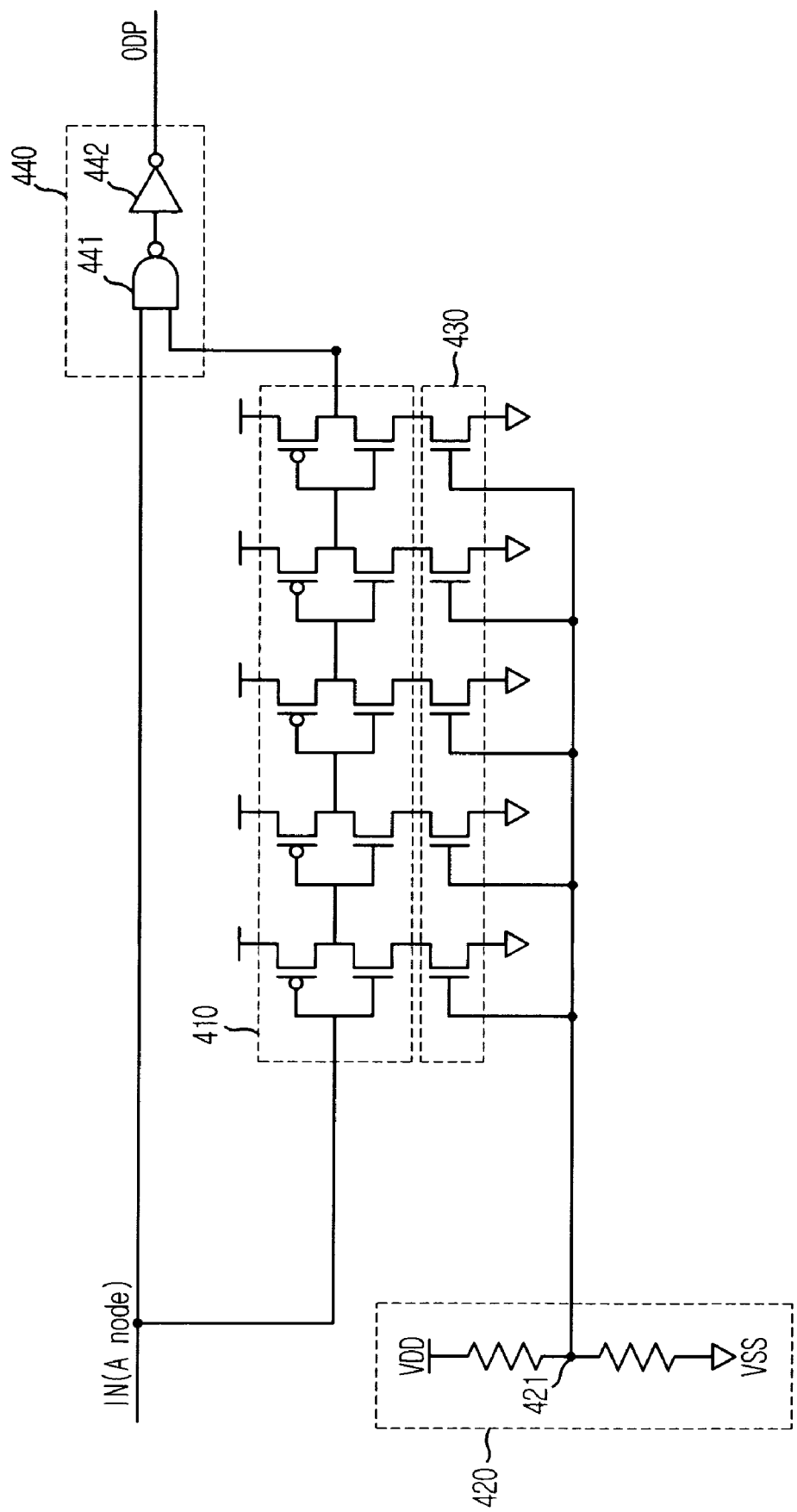
FIG. 5 illustrates a schematic circuit diagram describing an over driving pulse generator in accordance with the present invention.

FIG. 5 is a schematic circuit diagram describing an over driving controller 330, i.e., an over driving pulse generator, in accordance with the present invention. The over driving controller includes a delay unit 410, a supply voltage detector 420, a delaying controller 430 and an output unit 440. The delay unit 410 delays an input signal IN, which is activated in response to an active command and is inactivated in response to a precharge command. The input signal IN is delayed until the bit line sense amplifier is operated after the active command is inputted. The supply voltage detector 420 detects the level of the supply voltage VDD. The delaying controller 430 controls a delay time of the delay unit 410 in response to an output signal of the supply voltage detector 420. The output unit 440 outputs a pulse, whose width is controlled according to the fluctuation of the supply voltage VDD, in response to the input signal IN and an output of the delay unit 410.

Figure 6:
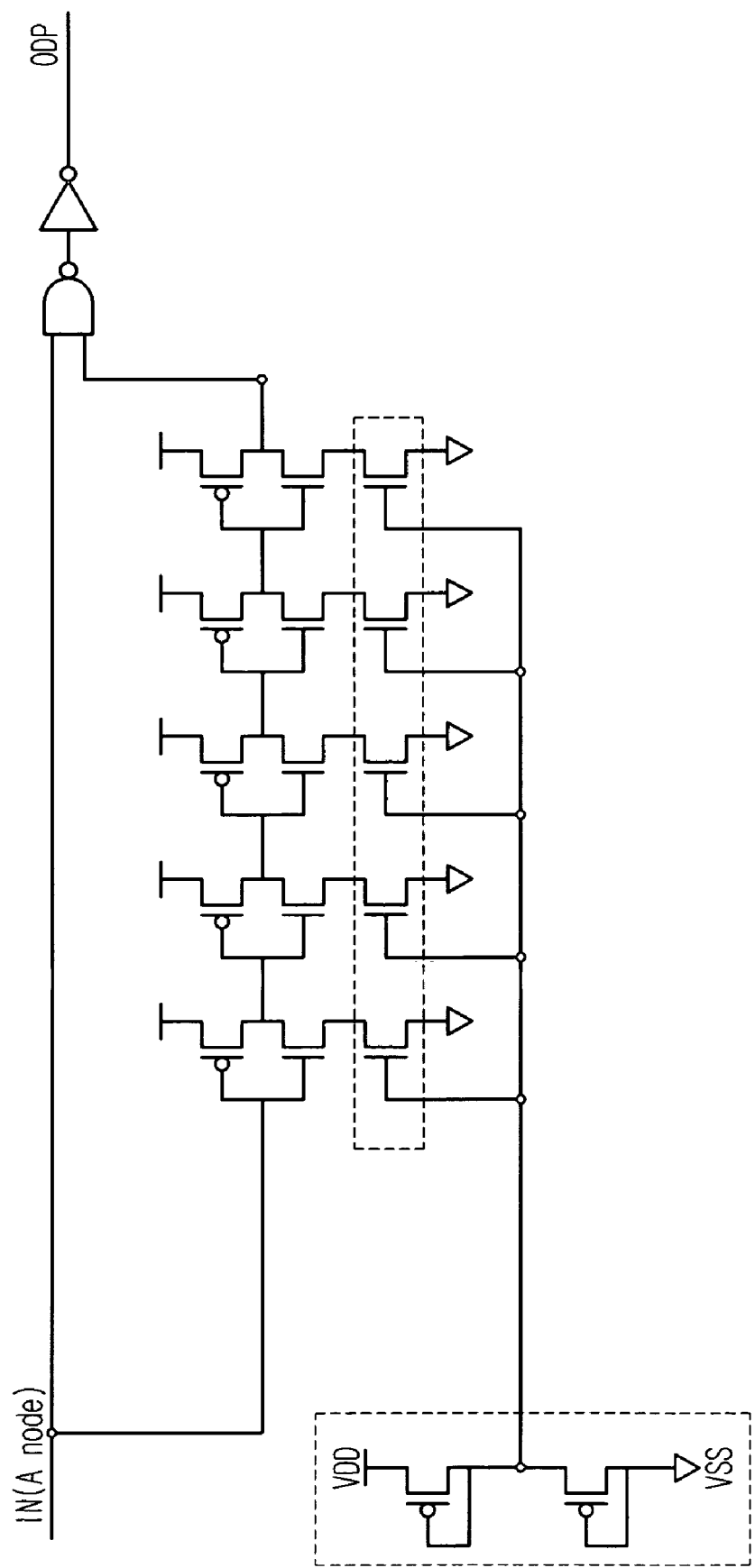
FIG. 6 is a schematic circuit diagram describing an over driving pulse generator in accordance with another embodiment of the present invention.

The supply voltage detector 420 is provided with two resistors R1 and R2 connected in series between the supply voltage VDD and the ground voltage VSS. Two resistors R1 and R2, whose connecting node 421 is an output node of the supply voltage detector 420, divide voltage potential between the supply voltage VDD and the ground voltage VSS. A resistance ratio between resistors R1 and R2 is determined according to characters of current sink transistors, referred to below. If the supply voltage VDD is a relatively high level, the level of the output node 421 is also high. If the supply voltage VDD is a relatively low level, the level of the output node 421 is also low. While the supply voltage detector 420 is provided with two resistors in above embodiment, transistors connected to a diode can be used as described in another embodiment of FIG. 6. In addition, general voltage dividers including a plurality of resistors can be used. In the memory device, there are a plurality of supply voltage nodes and a plurality of nodes. One of the nodes, wherein the supply voltage VDD is divided, existing inside can be used to embody the supply voltage detector 420.

The delay unit 410, including a plurality of inverters in series, delays input signal IN by delay times of the inverters. The delaying controller 430 controls the delay time of the delay unit 410. The delaying controller 430 includes the current sink transistors connected to the inverters constituting the delay unit 410. The current sink transistors receive an output of the supply voltage detector 420 through gates. A gate-source voltage Vgs of each current sink transistor is determined according to the level of the supply voltage VDD.

Accordingly, the supply voltage VDD having a relatively low level can turn on the current sink transistors. As described above, the supply voltage VDD is about 1.8 volts even in the DDR2 SDRAM having a low level of supply voltage VDD. Thus, transistors included in the DDR2 SDRAM are operated at the 1.8 voltage level. However, the current is not sunk sufficiently through the transistors because of a low operation voltage. An operation of inverters included in the delay unit 410 slows down. The delay time of the delay unit 410 is lengthened relatively.

The output unit 440 is provided with a NAND gate 441 and an inverter 442. The NAND gate 441 receives the input signal IN and an output of the delay unit 410. The inverter 442, receiving an output of the NAND gate 441, outputs the over driving pulse ODP.

The width of the over driving pulse ODP is determined according to the delay time of the delay unit 410. Accordingly, the over driving pulse generator according to the present invention generates a pulse having its width controlled based on the fluctuation of the supply voltage VDD.

The pulse generator in accordance with the present invention is used for controlling not only the over driving period at sensing the bit line pair but also other periods. An inverter delay circuit and a RC delay circuit can be applied to the pulse generator. Besides using the current sink transistors, the delay time of the delay unit can be changed through other methods.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a bit line sense amplifier for amplifying a voltage potential difference of a bit line pair;
   a sense amplifying driver for supplying a high driving voltage to enable the bit line sense amplifier during an over driving period; and
   an over driving controller for controlling the over driving period according to fluctuation of a supply voltage, wherein the over driving controller includes a pulse generator for generating an over driving pulse having a width controlled according to the fluctuation of the supply voltage, wherein the pulse generator includes:
a delay unit for delaying an input signal, wherein the delay unit includes a plurality of inverters in series;
a supply voltage detector for detecting the level of the supply voltage, wherein the supply voltage detector generates an output that is directly proportional to the supply voltage;
a delaying controller for controlling a delay time of the delay unit in response to an output of the supply voltage detector, wherein the delaying controller includes current sink transistors connected to the inverters, each current sink transistor is coupled to the said output of the supply voltage detector and receives a signal that is directly proportional to the supply voltage; and
an output unit for outputting the over driving pulse by performing a logic operation to the input signal and an output of the delay unit.

2. The semiconductor memory device of claim 1, wherein the sense amplifying driver includes a driver for operating in response to the over driving pulse, to supply the higher driving voltage in the over driving period.

3. The semiconductor memory device of claim 1, wherein the current sink transistors, receiving the output of the supply voltage detector through gates, have gate-source voltages determined according to the level of the supply voltage.

4. The semiconductor memory device of claim 1, wherein the supply voltage detector includes a plurality of resistors connected in series between the supply voltage and a ground voltage, and outputs through one of connecting nodes of the resistors.

5. The semiconductor memory device of claim 1, wherein the supply voltage detector includes a plurality of transistors connected to a diode and connected in series between the supply voltage and a ground voltage, and outputs through one of connecting nodes of the transistors.

6. The semiconductor memory device of claim 1, wherein the supply voltage detector includes a plurality of resistors connected in series between the supply voltage and a ground voltage, and one of connecting nodes of the resistors becomes an output node according to resistance ratio controlled by characters of the current sink transistors.

7. The semiconductor memory device of claim 1, wherein the output unit includes:
a NAND gate for receiving the input signal and the output of the delay unit; and
an inverter for receiving an output of the NAND gate and outputting the over driving pulse.

8. An over driving pulse generator comprises:
a delay unit for delaying an input signal, wherein the delay unit includes a plurality of inverters in series;
a supply voltage detector for detecting the level of a supply voltage, wherein the supply voltage detector generates an output that is directly proportional to the supply voltage;
a delaying controller for controlling a delay time of the delay unit in response to an output of the supply voltage detector, wherein the delaying controller includes current sink transistors connected to the inverters, each current sink transistor is coupled to the said output of the supply voltage detector and receives a signal that is directly proportional to the supply voltage; and
an output unit for outputting an over driving pulse having a width controlled according to fluctuation of the supply voltage, in response to the input signal and an output of the delay unit.

9. The over driving pulse generator of claim 8, wherein the current sink transistors, receiving the output of the supply voltage detector through gates, have gate-source voltages determined according to the level of the supply voltage.

10. The over driving pulse generator of claim 8, wherein the supply voltage detector includes a plurality of resistors connected in series between the supply voltage and a ground voltage, and outputs through one of connecting nodes of the resistors.

11. The over driving pulse generator of claim 8, wherein the supply voltage detector includes a plurality of transistors connected to a diode and connected in series between the supply voltage and a ground voltage, and outputs through one of connecting nodes of the transistors.

12. The over driving pulse generator of claim 9, wherein the supply voltage detector includes a plurality of resistors connected in series between the supply voltage and a ground voltage, and one of connecting nodes of the resistors becomes an output node according to resistance ratio controlled by characters of the current sink transistors.

13. The over driving pulse generator of claim 8, wherein the output unit includes:
a NAND gate for receiving the input signal and the output of the delay unit; and
an inverter for receiving an output of the NAND gate and outputting the over driving pulse.

* * * * *